US012352913B2

(12) United States Patent
Silveira de Albuquerque Martins et al.

(10) Patent No.: US 12,352,913 B2
(45) Date of Patent: Jul. 8, 2025

(54) STORAGE AND RETRIEVAL OF SUBSURFACE ROCK PHYSICAL PROPERTY PREDICTION MODELS USING SEISMIC INTERPRETATION

(71) Applicants: International Business Machines Corporation, Armonk, NY (US); Petrogal Brasil S.A., Rio de Janeiro (BR)

(72) Inventors: Leonardo Silveira de Albuquerque Martins, Campinas (BR); Dario Sergio Cersosimo, Lisbon (PT); Leonardo Pondian Tizzei, Sao Paulo (BR); Emilio Ashton Vital Brazil, Rio de Janeiro (BR); Rodrigo da Silva Ferreira, Rio de Janeiro (BR); Renato Fontoura de Gusmao Cerqueira, Rio de Janeiro (BR); Joana de Noronha Ribeiro de Almeida, Lisbon (PT); Astrid de Jesus Torres Fernandez, Lisbon (PT); Ulisses Thibes Mello, Blauvelt, NY (US)

(73) Assignees: International Business Machines Corporation, Armonk, NY (US); Petrogal Brasil S.A., Rio de Janeiro (BR)

( * ) Notice: Subject to any disclaimer, the term of this patent is extended or adjusted under 35 U.S.C. 154(b) by 974 days.

(21) Appl. No.: 17/194,349

(22) Filed: Mar. 8, 2021

(65) Prior Publication Data
US 2022/0291405 A1 Sep. 15, 2022

(51) Int. Cl.
*G01V 1/28* (2006.01)
*G01V 1/50* (2006.01)
*G06F 30/20* (2020.01)

(52) U.S. Cl.
CPC .............. *G01V 1/282* (2013.01); *G01V 1/50* (2013.01); *G06F 30/20* (2020.01); *G01V 2210/61* (2013.01)

(58) Field of Classification Search
CPC ...... G01V 1/282; G01V 1/50; G01V 2210/61; G06F 30/20
See application file for complete search history.

(56) References Cited

U.S. PATENT DOCUMENTS

| 4,779,237 A | 10/1988 | Bodine |
| 5,444,619 A | 8/1995 | Hoskins et al. |

(Continued)

FOREIGN PATENT DOCUMENTS

CN 112198554 A 1/2021

OTHER PUBLICATIONS

Justel, A.; Peña, D.; Zamar, R., "A multivariate Kolmogorov-Smirnov test of goodness of fit", Statistics & Probability Letters, Oct. 1997, 35 (3):251-259.

(Continued)

*Primary Examiner* — Kibrom K Gebresilassie
(74) *Attorney, Agent, or Firm* — Scully, Scott, Murphy & Presser, P.C.; Edward J. Wixted, III (57) ABSTRACT

Storing and retrieving subsurface rock physical property models for well drilling by generating estimated subsurface rock physical property models based on a respective set of seismic data, determining a stratigraphic classification for each model based on seismic interpretation data; storing the models associated classification in a database, determining characteristics of the seismic data used to generate the models, selecting from the database a subset of the models based on a similarity of the stratigraphic classification, determining measures of similarity between the characteristics of the seismic data used to generate each of subset of (Continued)

the models and a new set of seismic data and retrieving an estimated subsurface rock physical property model from the subset models based on the similarity measures.

17 Claims, 8 Drawing Sheets

(56) References Cited

U.S. PATENT DOCUMENTS

| | | | |
|---|---|---|---|
| 6,438,493 B1 | 8/2002 | West et al. | |
| 6,654,692 B1* | 11/2003 | Neff | G01V 1/306 |
| | | | 702/7 |
| 7,373,251 B2* | 5/2008 | Hamman | G01V 1/306 |
| | | | 702/14 |
| 7,620,534 B2 | 11/2009 | Pita et al. | |
| 8,473,213 B2 | 6/2013 | Zhu et al. | |
| 8,600,716 B2 | 12/2013 | Bradford | |
| 9,008,972 B2* | 4/2015 | Imhof | G01V 1/307 |
| | | | 702/13 |
| 9,182,510 B2 | 11/2015 | Langenwalter et al. | |
| 10,534,101 B2* | 1/2020 | Etgen | G01V 1/345 |
| 10,761,231 B2 | 9/2020 | Zhang et al. | |
| 10,920,585 B2* | 2/2021 | Colombo | G01V 3/165 |
| 10,990,882 B2* | 4/2021 | Borrel | G01V 1/50 |
| 2019/0034812 A1* | 1/2019 | Borrel | G06N 20/00 |
| 2019/0137639 A1 | 5/2019 | Walsh, III | |
| 2020/0019882 A1* | 1/2020 | Garg | G06F 21/6218 |
| 2021/0293990 A1* | 9/2021 | Servais | E21B 49/00 |

OTHER PUBLICATIONS

Fasano, G., Franceschini, A., "A multidimensional version of the Kolmogorov-Smirnov test", Monthly Notices of the Royal Astronomical Society, Mar. 1987, 225: 155-170.

* cited by examiner

STORAGE AND RETRIEVAL OF SUBSURFACE ROCK PHYSICAL PROPERTY PREDICTION MODELS USING SEISMIC INTERPRETATION

BACKGROUND OF THE INVENTION

This disclosure is directed to computers, and computer applications, and more particularly to computer-implemented methods and systems for storing and retrieving subsurface rock physical property models for well drilling.

Well drilling is a costly activity in the oil and gas exploration industry. Companies need to rely on statistical models that correlate acoustic seismic reflection survey data (abundant, relatively cheap), and well bore log measurements (sparse, very expensive) of subsurface rock physical properties, to predict such properties in other areas without well measurements.

A common problem in exploration geology and geophysics is to estimate a statistical relationship that describe subsurface reservoir physical properties observed from well log data as a function of seismic data as input. Such seismic survey data are commonly augmented in the form of attributes derived from, e.g. discrete signal processing. Several attempts have been made to derive such attributes from seismic data in a physically meaningful way and currently the literature consists of roughly several dozen attributes that have been proposed based on the experience of exploration geologists and geophysicists.

A hydrocarbon reservoir is defined by fluid accumulation in subsurface rock pores of some geological formation. Their petro-related physical properties are measured with relative accuracy around the areas where wells are drilled. However, such properties need to be necessarily estimated in areas of the reservoir where no wells have been drilled. This is necessary in order to hopefully improve subsurface characterization and thus reduce development risks. Such estimates can be statistically realized for different confidence degrees of the correlation between seismic profiles (digital signals representing the response from acoustic wave reflections), and those physical properties observed in the wells. For example, one prior art system uses a method based on artificial neural networks to correlate seismic profile data-derived attributes with well log data.

By their vary nature, the use of statistical models of correlation to predict subsurface physical rock properties in areas other than those used to estimate the models themselves incur prediction errors. This is due to the geological complexity of the configuration of subsurface rocks, presenting factors not captured in the seismic data resolution, or even in the interaction of different physical phenomena during the dispersion of the acoustic wave. However, prior art systems and methods deal only with the methodology to calibrate the prediction models.

SUMMARY OF THE INVENTION

One embodiment of a computer implemented method for storing and retrieving subsurface rock physical property models for well drilling, includes the steps of: generating a plurality of estimated subsurface rock physical property models, each estimated subsurface rock physical property model being based on a respective set of seismic data; determining a stratigraphic classification based on seismic interpretation data for each of the plurality of estimated subsurface rock physical property models; storing the plurality of estimated subsurface rock physical property models associated with its respective stratigraphic classification in a database; determining characteristics of the seismic data used to generate each of the estimated subsurface rock physical property models; selecting from the database a subset of the estimated subsurface rock physical property models based on a similarity of the stratigraphic classification; determining measures of similarity between the characteristics of the seismic data used to generate each of subset of estimated subsurface rock physical property models and a new set of seismic data; and retrieving at least one estimated subsurface rock physical property model from the subset of estimated subsurface rock physical property model based on the similarity measures.

A computer system that includes one or more processors operable to perform one or more methods described herein also may be provided.

A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

DETAILED DESCRIPTION OF PREFERRED EMBODIMENTS

In one embodiment, a method and system to systematically store models to be reused across exploration projects is disclosed. In one embodiment, the method and system consistently assesses applicability of the models to different seismic data sets, thus identifying measures of similarity between areas where measurements from well log data were used to calibrate the models, and those areas where the models are expected to be used for prediction of the corresponding physical properties.

The various known statistical subsurface rock physical property models are not currently being managed and therefore are not directly available for systematic reuse in new exploration projects. This is due to the lack of systems and methods that manage the creation and reuse of such models in a systematic way. In early exploration phases of new areas, exploration companies would have to rely on models of lower quality based on a small number of wells, or even on subjective judgment to select a previous model for reuse when well log data are not readily available.

The methods and systems disclosed herein solves the problem by managing the estimation, storage and retrieval of subsurface rock physical property prediction models and by leveraging seismic interpretation with stratigraphic classification to index and assess their applicability in a given location.

Figure 1:
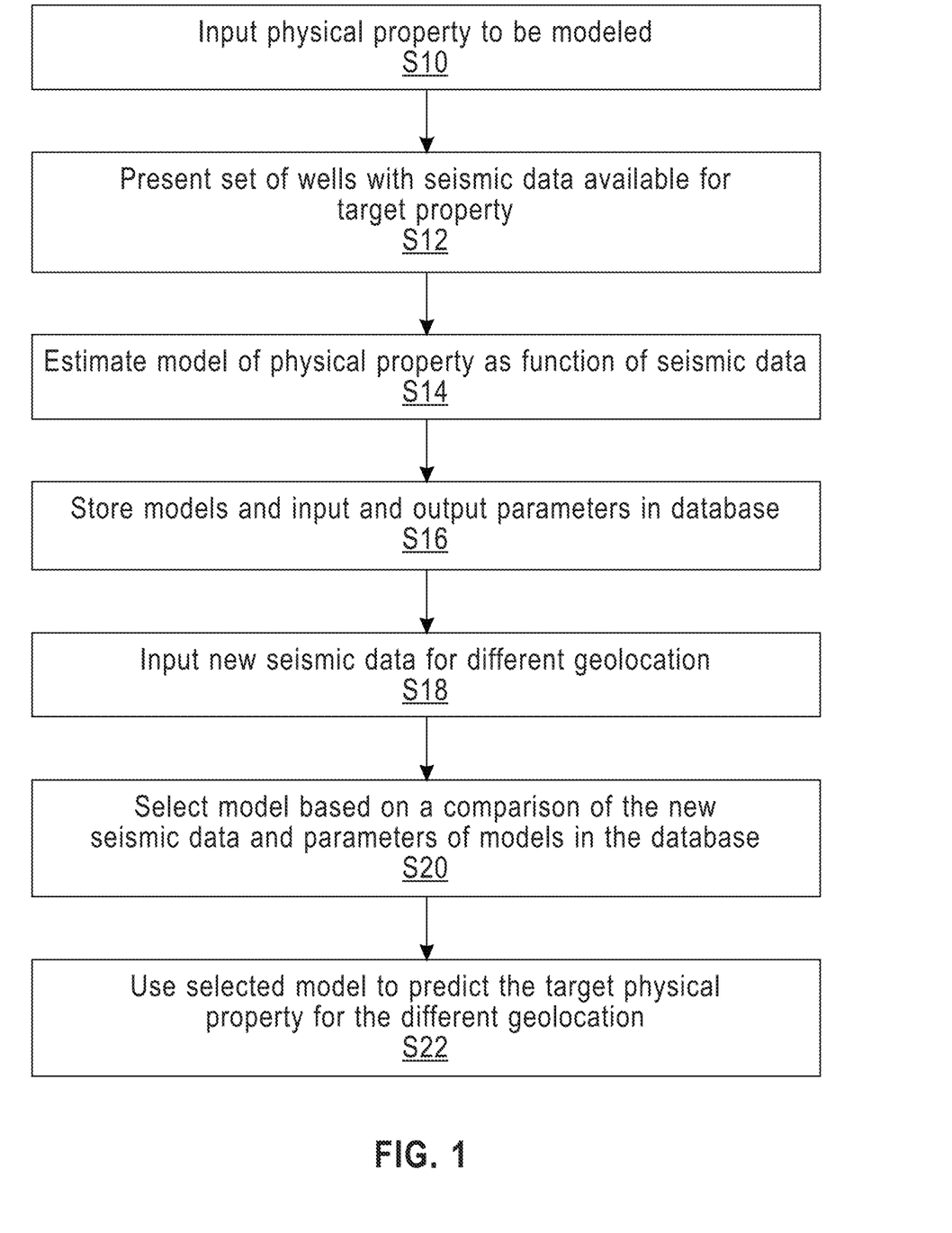
FIG. 1 is a flow diagram of one embodiment of a method for storing and retrieving subsurface rock physical property models disclosed in this specification.

In one embodiment of a method, as shown in FIG. 1, in step S10, a user inputs into the computer system a physical property to be statistically modeled for prediction. In step S12, the system presents to the user a set of georeferenced wells with seismic data available for the target property. In step S14, a regression model is estimated by the computer system describing the physical property as a function of the seismic data and its transformations based on the georeferenced seismic data associated with each well selected by the user. In step S16, the regression model and the input and output parameters of the model are stored in a database. A plurality of models is stored in the database according to steps S10-step S16. In step S18 a user inputs in the computer system new seismic data for a different geolocation not necessarily with data from drilled wells. In step S20, the computer system selects a previously stored model based on a comparison of the new seismic data and the parameters stored with the models in the database. In step S22 the selected model is used to predict the target physical property for the different geolocation.

In one embodiment, in step S14, user-provided seismic interpretation data, such as top formations, in the form of reflection horizons are used as an input parameter in the regression model. The seismic interpretation data is stored with the model in step S16. In one embodiment, the seismic interpretation data vertically normalizes data in the regression model estimation. In one embodiment, the Z-axis (depth) can be used as a covariate that is normalized between the stratigraphic layers given as top formations associated with interpreted horizons. For example, seismic interpretation in the form of reflection horizons used for data normalization in the z-axis can be described stratigraphic events that define the limits of a possible hydrocarbon reservoir. In one embodiment, these seismic interpretation data are then provided by the experts as input to the computer system in step S14. Alternatively, in one embodiment, the seismic interpretation data can be automatically generated by a mathematical model, such as a high resolution model or a seismic velocity model.

In one embodiment, step S14 includes determining a seismic stratigraphic classification by the computer system based on the seismic interpretation data and using the classification to index the vertical applicability of the model in the database. In one embodiment, Step S16 includes storing the resulting model in the database indexed by the stratigraphically classified interpreted horizons, in the form of its coefficients (e.g. weights and biases). In addition, in one embodiment, step S14 includes determining discretized distribution functions of the input seismic data by the computer system and step S16 includes storing the distributions with the model. In one embodiment, step S14 includes calculating image texture descriptors by the computer system over the seismic data geo-associated with well locations and step S16 includes storing the image texture descriptors with the model. In one embodiment, step S14 includes determining statistical measures of the association, for example, coefficient of determination ($R^2$) and step S16 includes storing statistical measures of the association with the model.

In one embodiment, in step S20, for a given location with seismic data and interpretation available arbitrarily selected by user, computer system will suggest and retrieve a model from the database based on determining vertical applicability by comparing the classified seismic stratigraphies; calculating and comparing a similarity measure based on image texture descriptors thereby serving as a horizontal filter, and calculating and comparing multivariate statistical goodness-of-fit metrics between a given area whose physical properties are to be predicted, and the areas used to calibrate the models. In one embodiment, the model retrieval is determined from a seismic similarity based on symmetric goodness-of-fit statistical metrics and/or complementary measures of discrepancy between distribution functions of seismic data and their derivatives during (1) training/validation, and (2) prediction times, for example the Kolmogorov-Smirnov test, or the Hellinger distance.

The methods and systems disclosed herein overcomes the uncertainties involved in using current models through the identification of geological similarity between the areas used to estimate the models and those where the models are to be used to predict the underlying physical properties. For example, in the methods and systems disclosed herein, material properties statistically correlated, either positively or negatively, with physical properties of a different nature, e.g. electrical or radioactive are used to select a prior subsurface rock physical property model to predict the underlying physical properties.

Figure 2:
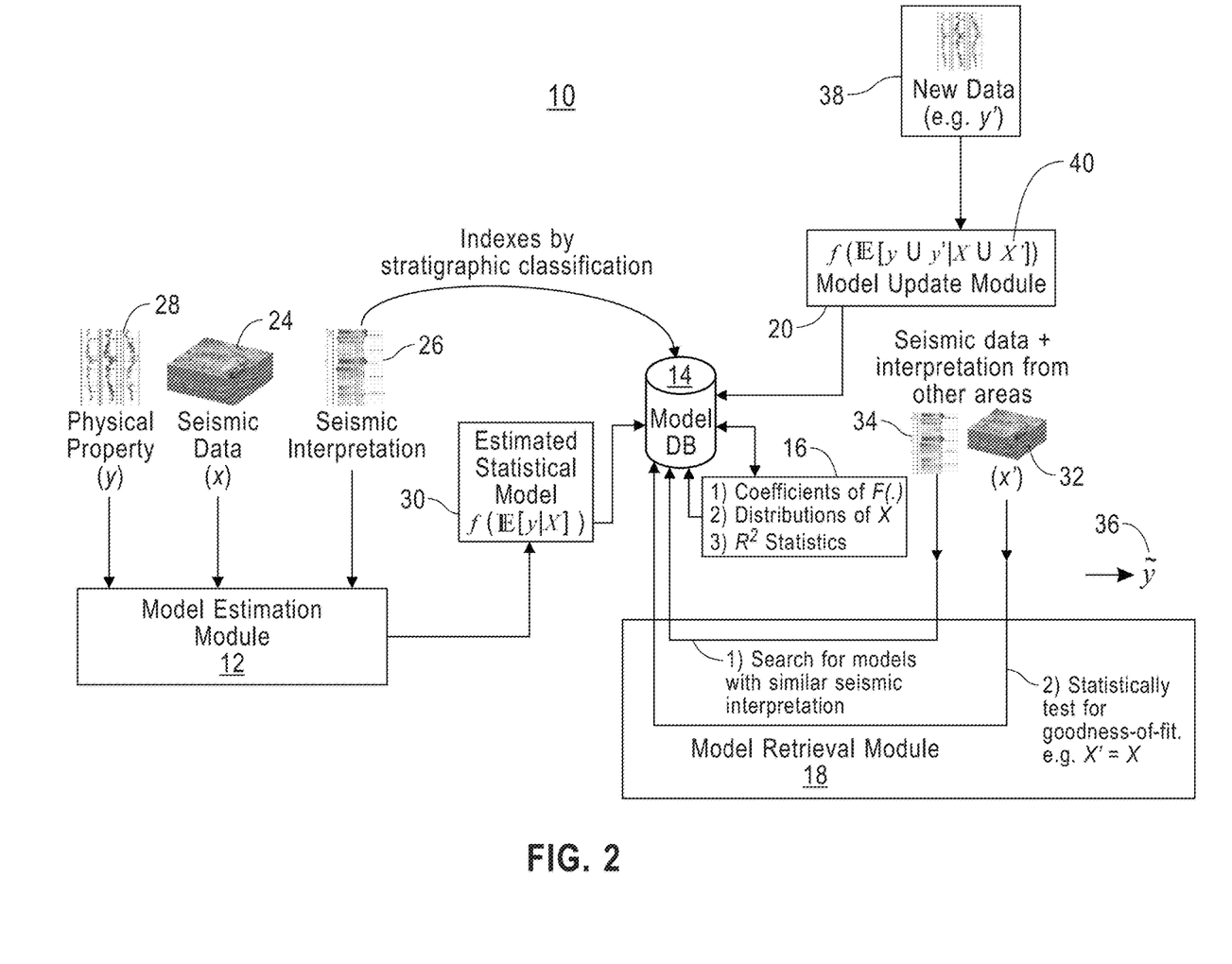
FIG. 2 is a block diagram of a system for storing and retrieving subsurface rock physical property models disclosed in this specification.

In one embodiment, as shown in FIG. 2, the computer system 10 for performing the methods disclosed herein for storing and retrieving subsurface rock physical property models for well drilling may include a model estimation module 12, a model database 14, a seismic data characteristics module 16, a model retrieval module 18 and a model update module 20. Details of one embodiment of a computer system 10 will be described later in connection with FIG. 8.

In one embodiment, model estimation module 12 estimates a subsurface rock physical property model that correlates seismic data (X) 24 and their derivatives with well log data. A set of seismic interpretations 26 is associated with each model estimated in the model database 14. As noted above, these horizons can be classified either by the user, experts or a system in terms of their lithological characteristics in the observed stratigraphy. These classifications will be stored with the model in database 14 and later used for retrieval by model retrieval module 18 as a vertical filter. In one embodiment, any model that correlates seismic data and their derivatives with well log data may be suitable for storage and later retrieval.

Figure 3:
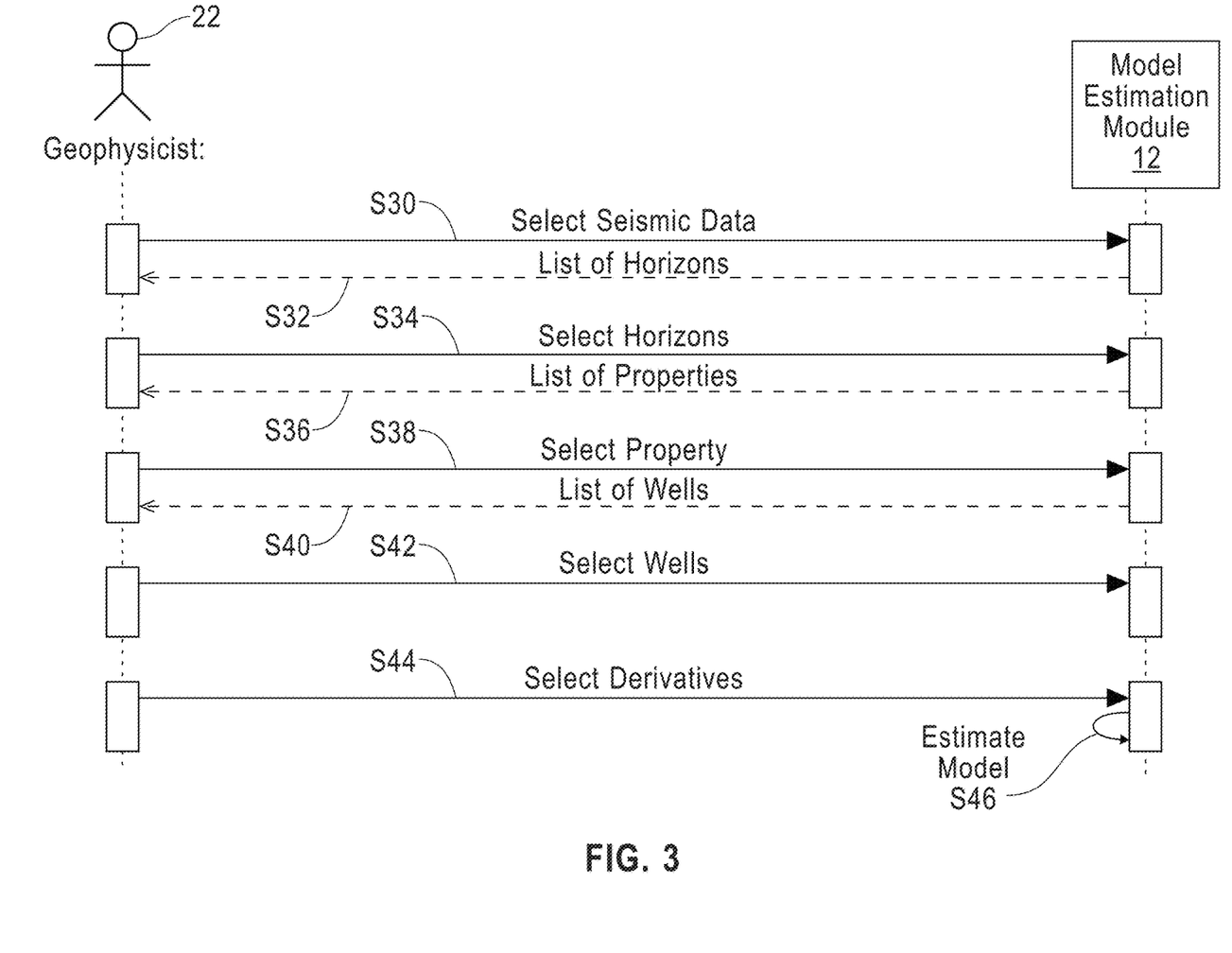
FIG. 3 is a flow diagram of one embodiment of a method of model estimation disclosed in this specification.

In one embodiment, as shown in the flow diagram of FIG. 3, for model estimation, the user 22 selects a set of the seismic data 24 in step S30. In step S32, a list of the seismic interpretations 26, such as horizons, is provided by model estimation module 12 to the user 22. The user 22 selects particular interpretations of interest, such as two or more horizons, in step S34, and model estimation module 12 returns to the user 22 in step S36 a list of physical properties 28 available in well logs in the vertical area, for example defined by the topmost and bottom most horizons. The user 22 in step S38 selects the desired physical property (y) 28 to be modeled, and in step S40 the model estimation module 12 returns to the user 22 a list of wells with this property available. The user 22 in step S42 selects the wells to be used to correlate the desired physical property 28 and the seismic data 24. Next, the user 22 selects in step S44 a set of seismic data derivatives (attributes), and in step S46 the model estimation module 12 runs the model estimation algorithm resulting in the estimated subsurface rock physical property model 30 f($\mathbb{E}$ E[y|X]).

As shown in FIG. 2, the estimated subsurface rock physical property model 30 input to seismic data characteristics module 16. In one embodiment, module 16 calculates coefficients of F(.) describing the functional relationship between physical property and seismic data derivatives of the model 30. In one embodiment, module 16 calculates a statistical test on a reference well, such as a ground truth used for testing the model 30. In one embodiment, Kolmogorov-Smirnov and $R^2$ test statistics are calculated. Kolmogorov-Smirnov is a measure of the distance between the empirical distribution function of the sample and the cumulative distribution function of the reference distribution. $R^2$ is the proportion of the variance in the dependent variable that is predictable from the independent variable(s). In one embodiment, module 16 calculates a discrete distribution of X, such as a histogram of the covariates, such as seismic data and their derivatives, on the ground truth well. The seismic data characteristics calculated by the module 16 are stored with the model 30 together with the reference well.

Figure 4:
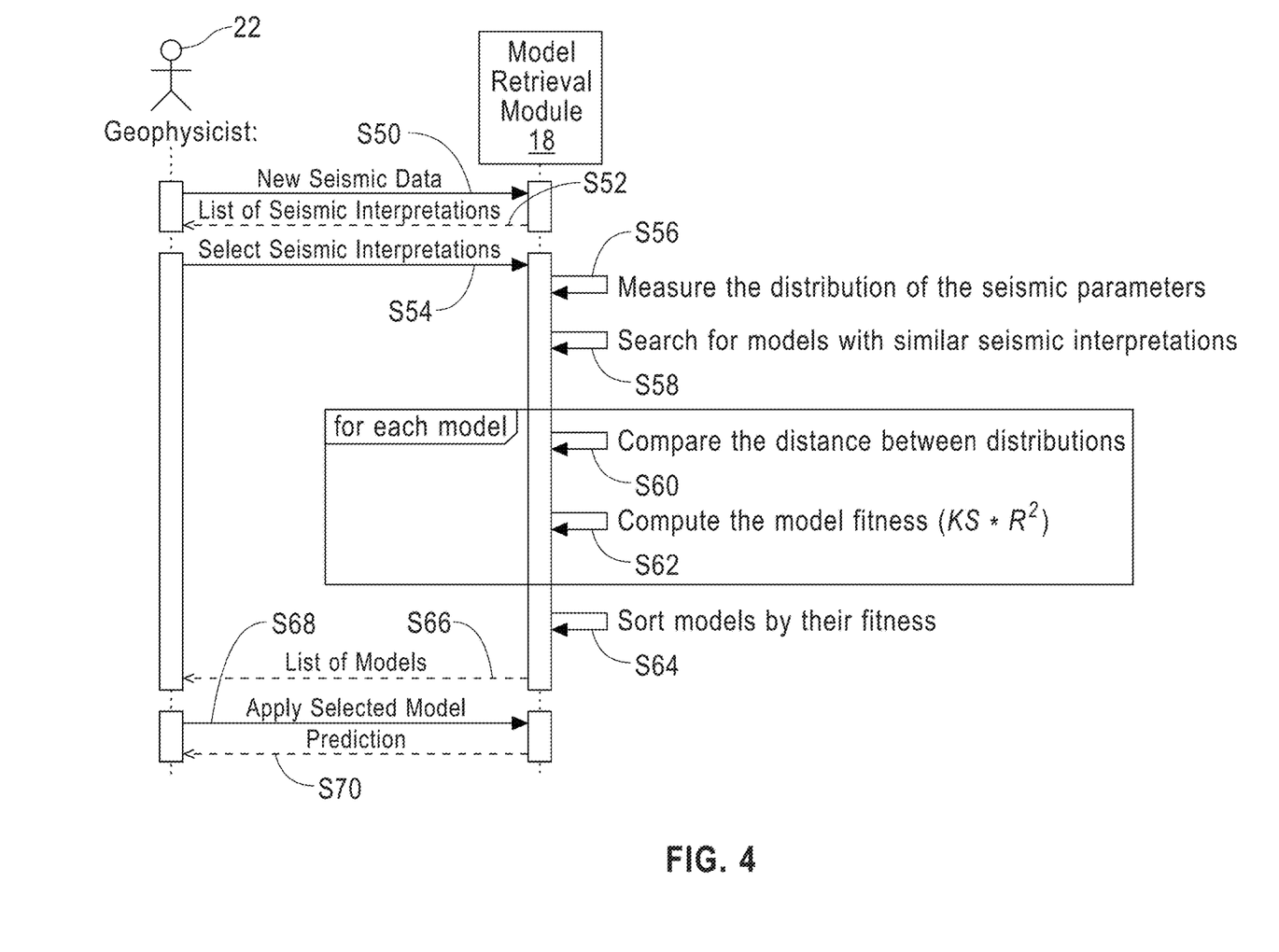
FIG. 4 is a flow diagram of one embodiment of a method of model estimation disclosed in this specification.

Referring now to FIGS. 2 and 4, a new set of seismic data X' 32 and interpretations 34 are input to the model retrieval module 18 by the user 22 in step S50 and a list of available interpretations, such as seismic horizons, is returned to the user in step S52. The user 22 selects a subset of these horizons in step S54. The model retrieval module 18 measures the statistical distribution of seismic data and its derivatives in step S56. The model retrieval module 18 searches for models associated with horizons whose classifications match those of the subset of horizons selected by the user 22 in step S58. For each model stored in database 14, the model retrieval module 18, in step S60 compares the distance (goodness-of-fit) of the distribution of the model to the one just calculated by model estimation module 12. The final model fitness is computed in step S62 as a product of this goodness-of-fit by the statistical test. For example, a Kolmogorov-Smirnov goodness-of-fit multiplied by an R-squared is calculated and associated with every model stored in step S62. In one embodiment, a measure of correlation MC is determined between ŷ and y in a known blind test well e.g. $R^2$, as taught by Spearman, a measure of similarity MS is determined between covariate distributions D(X) and D(X'), e.g. as taught by Kolmogorov-Smirnov and the product is determined between 0 and 1 by 0≤MC×MS≤1.

In step S64 the list of models is sorted by this resulting product. This list is presented to the user 22 in step S66, who will decide which model to be used to predict the underlying physical property in the seismic area. In step S68 the selected model is applied and in step S70 the prediction ŷ=f(X') 36 of the subsurface physical property in the seismic area is returned to the user 22. Therefore, the methods and system disclosed improves upon the technology used for predicting subsurface rock physical properties by reusing the statistical models for prediction in arbitrarily selected areas with geologically analogous seismic interpretation.

Figure 5:
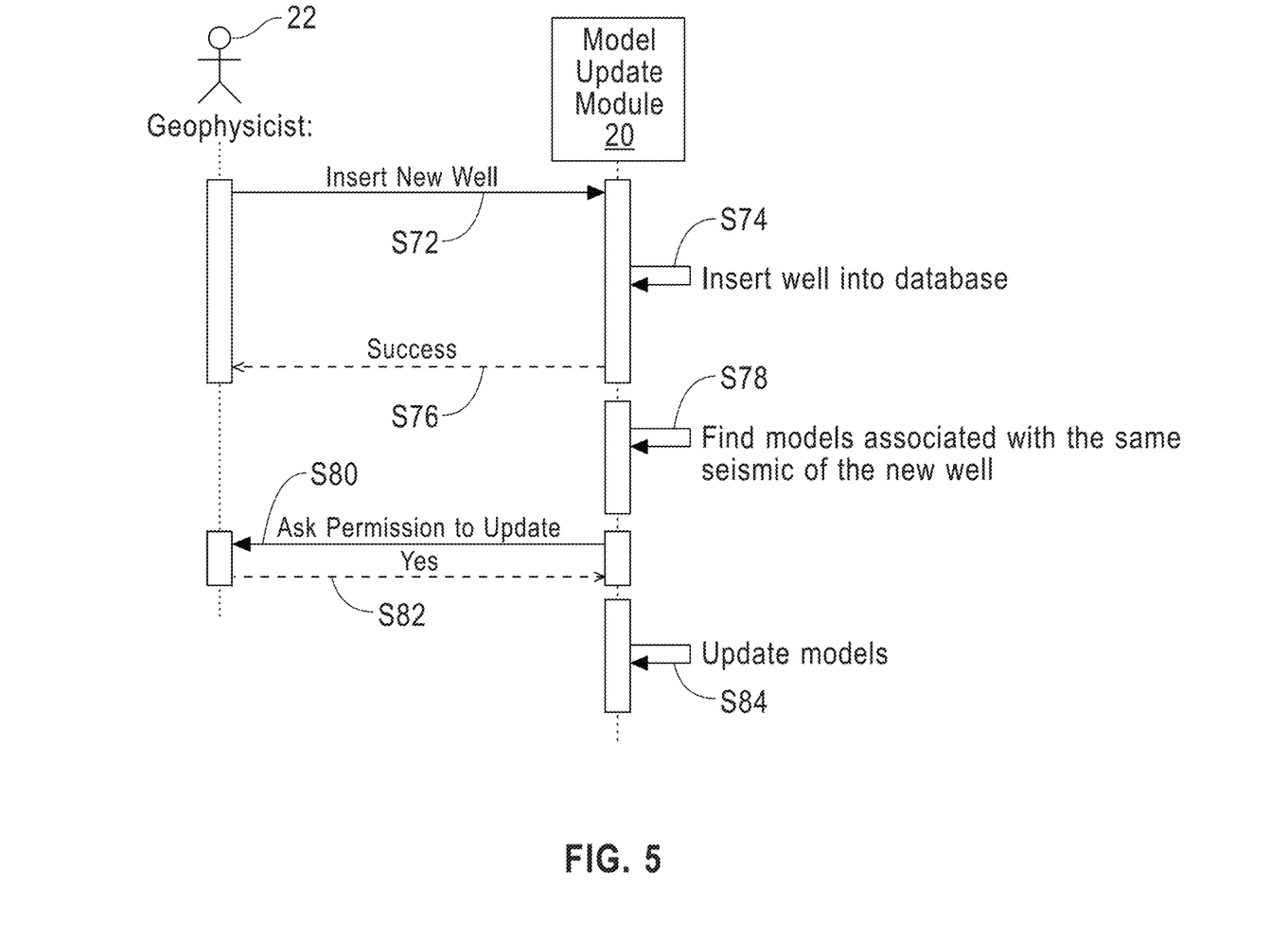
FIG. 5 is a flow diagram of one embodiment of a method of model retrieval disclosed in this specification.

In one embodiment, new well data can be used to update the statistical models. As shown in FIG. 5, in step S72, the user 22 inserts a new well data (y') 38 into the model update module 20. In step S74 the new well data 38 is inserted into database 14. The user 22 is notified of the successful insertion of the new well data 32 into the database 14 in step S76. In step S78 the update module 20 searches for and finds models associated with the same seismic data of the new well. The user 22 is asked for permission to update the model in step S80. When the user 22 returns a Yes in step S82, the module 20 updates the model f($\mathbb{E}$ [y∪y'|X∪X']) 40 in the database 14 in step S84.

Figure 6:
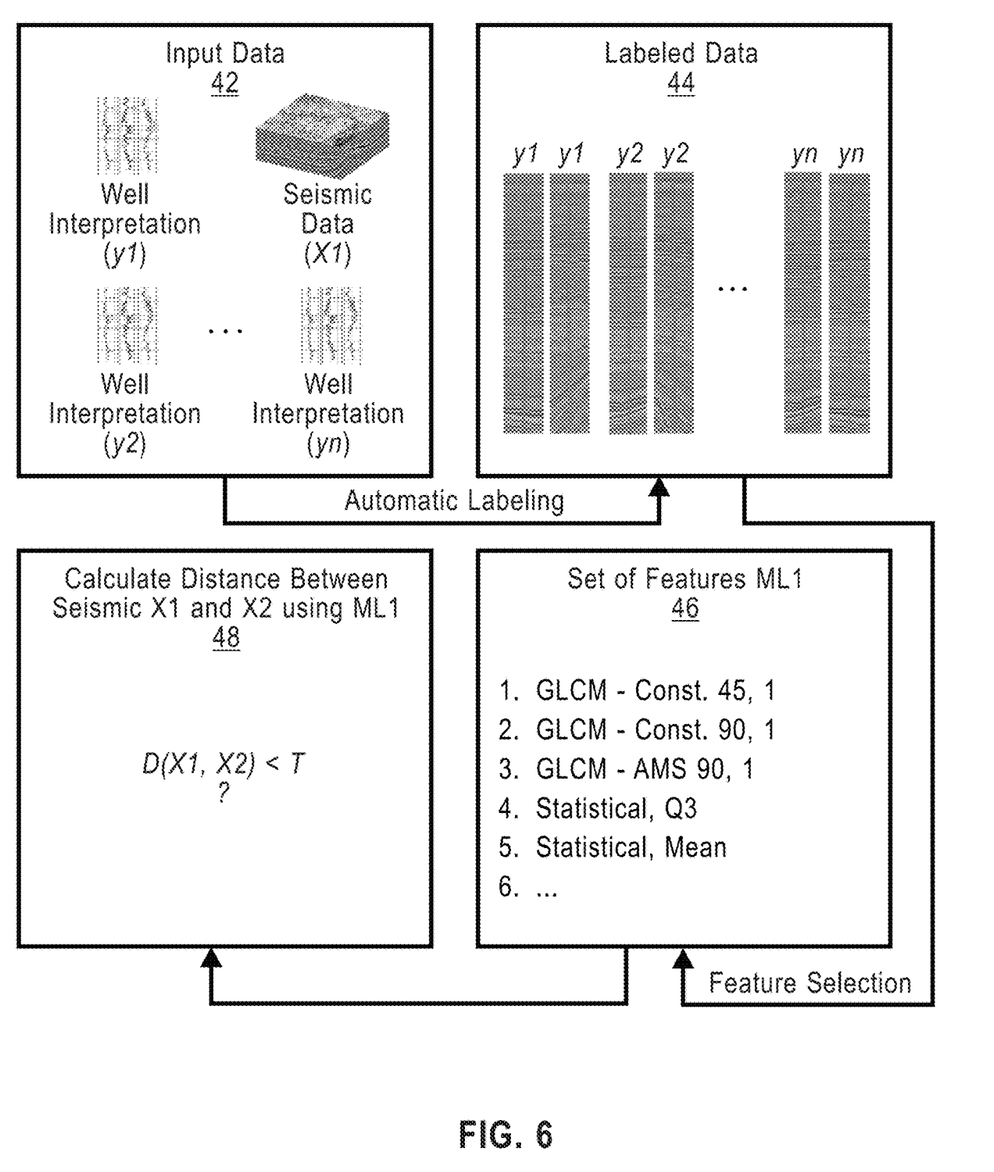
FIG. 6 is a flow diagram of one embodiment of a method of model retrieval disclosed in this specification.

In one example, given a seismic S1, which does not have a polarization-position correlation (PPC) model, the system 10 for storing and retrieving subsurface rock physical property models find the best possible candidate in the model database to calculate the physical property in S1. For example, the system 10 compares two seismic, taking into account the well information used to create the model. Given a seismic image, its response to metrics can vary depending on many factors like the acquisition setup, the signal processes, and the local geology, among others. Because it is difficult to define a metric up front, then the metric must be tailored by the model (set of wells and seismic survey). As shown in FIG. 6, the system 10 solves this difficult problem by, for each new model validated, using as input data 42, the seismic data X1 and the interpretation in the wells y1, y2, . . . yn used to create the model to label the neighborhood of the seismic surrounding the wells to create a labeled data set 44. This data set then is used to extract the best set of features 46 to represent the relationship between seismic and well. For example, the features ML1 may be 1. GLCM—Const. 45, 1; 2. GLCM—Const. 90, 1; 3. GLCM—AMS 90, 1; 4. Statistical, Q3; 5. Statistical, Mean. Then, to get the best possible model to be used in a seismic, the system 10 uses the set of best features to generate the distance 48. If this distance is less than a threshold, the model is considered suitable to be used in that seismic, and further sorted by a measure of feature (seismic data and their derivatives) distribution distance, e.g., Kolmogorov-Smirnov. In one embodiment, the distance between Seismic X1 and X2 using ML1 is calculated by D(X1,X2)<T.

Figure 7:
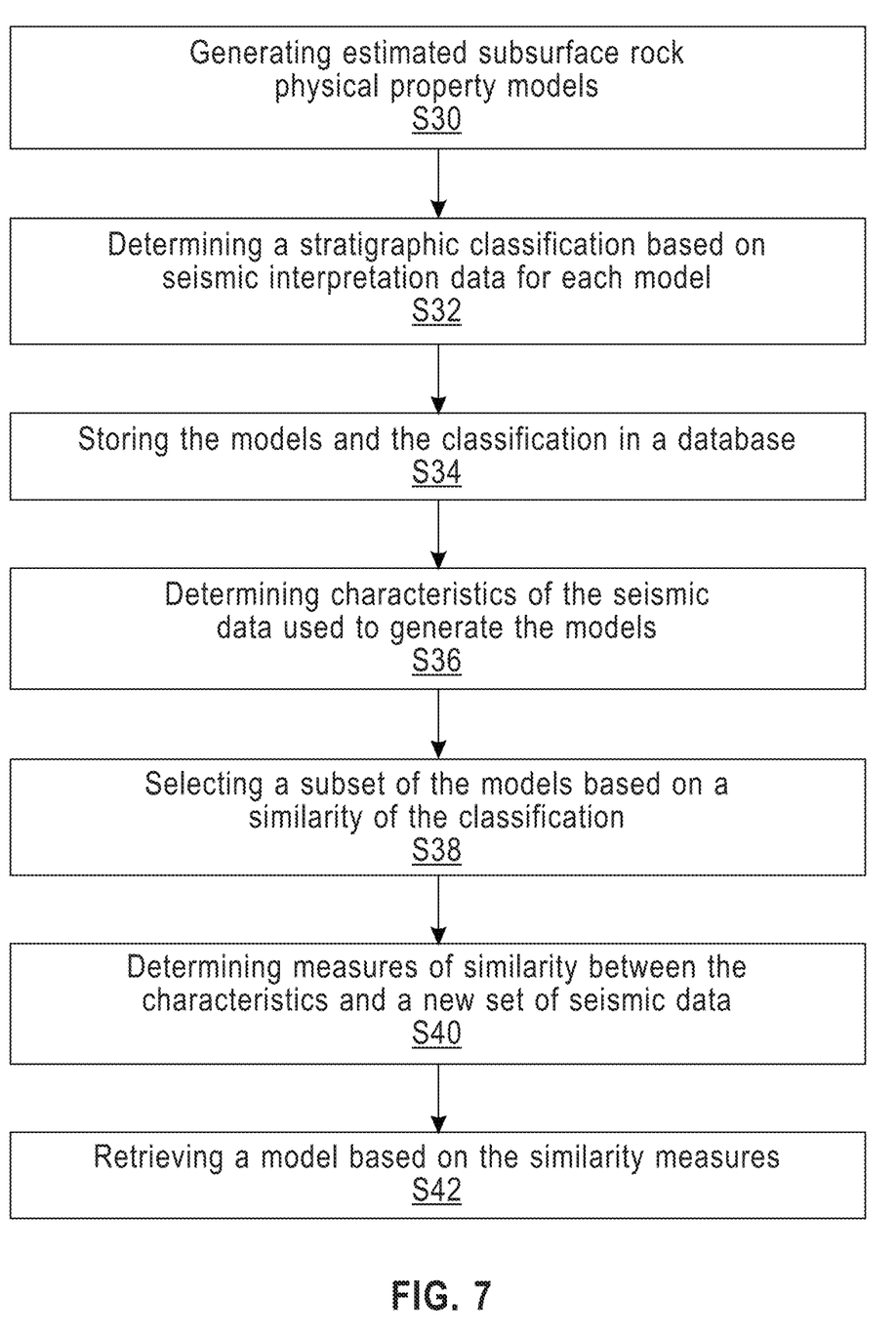
FIG. 7 is a flow diagram of one embodiment of a method of model comparison disclosed in this specification.

FIG. 7 is a flow chart of another embodiment for storing and retrieving subsurface rock physical property models for well drilling, in which the computer system 10 performs the steps of: S30 of generating a plurality of estimated subsurface rock physical property models, each estimated subsurface rock physical property model being based on a respective set of seismic data; step S32 of determining a stratigraphic classification based on seismic interpretation data for each of the plurality of estimated subsurface rock physical property models; step S34 of storing the plurality of estimated subsurface rock physical property models associated with its respective stratigraphic classification in a database; step S36 of determining characteristics of the seismic data used to generate each of the estimated subsurface rock physical property models; step S38 of selecting from the database a subset of the estimated subsurface rock physical property models based on a similarity of the stratigraphic classification; step S40 of determining measures of similarity between the characteristics of the seismic data used to generate each of subset of estimated subsurface rock physical property models and a new set of seismic data; and step S42 of retrieving at least one estimated subsurface rock physical property model from the subset of estimated subsurface rock physical property model based on the similarity measures.

Figure 8:
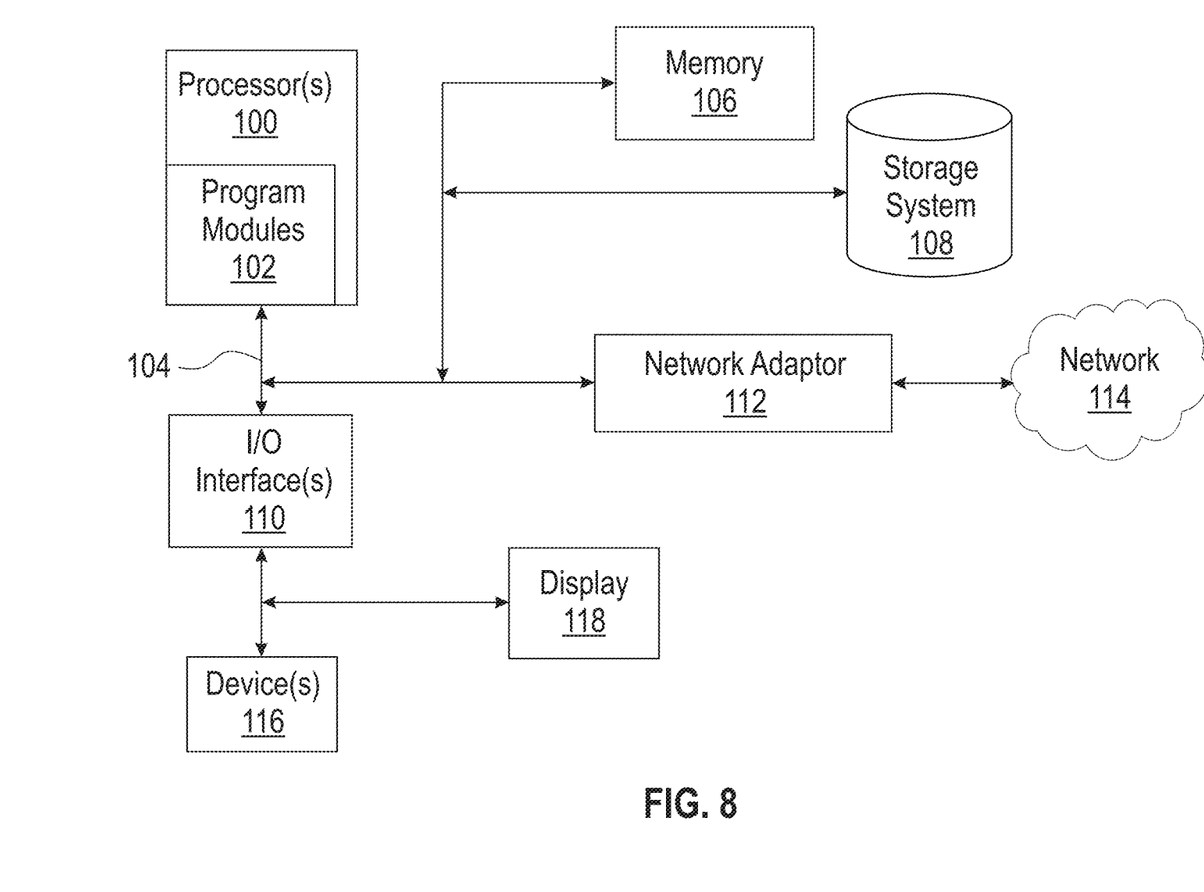
FIG. 8 is a block diagram of an exemplary computing system suitable for implementation of the embodiments of the invention disclosed in this specification.

FIG. 8 illustrates a schematic of an example computer or processing system that may implement the method for storing and retrieving subsurface rock physical property models for well drilling in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 7 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 100, a system memory 106, and a bus 104 that couples various system components including system memory 106 to processor 100. The processor 100 may include program modules 102 that performs the methods described herein, such as, for example, modules 12, 16, 18 and 20 of FIG. 1. The modules 102 may be programmed into the integrated circuits of the processor 100, or loaded from memory 106, storage device 108, or network 114 or combinations thereof.

Bus 104 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 106 can include computer system readable media in the form of volatile memory, such as random access memory (RAM) and/or cache memory or others. Computer system may further include other removable/non-removable, volatile/non-volatile computer system storage media. By way of example only, storage system 108 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 104 by one or more data media interfaces.

Computer system may also communicate with one or more external devices 116 such as a keyboard, a pointing device, a display 118, etc.; one or more devices that enable a user to interact with computer system; and/or any devices (e.g., network card, modem, etc.) that enable computer system to communicate with one or more other computing devices. Such communication can occur via Input/Output (I/O) interfaces 110.

Still yet, computer system can communicate with one or more networks 114 such as a local area network (LAN), a general wide area network (WAN), and/or a public network (e.g., the Internet) via network adapter 112. As depicted, network adapter 112 communicates with the other components of computer system via bus 104. It should be understood that although not shown, other hardware and/or software components could be used in conjunction with computer system. Examples include, but are not limited to: microcode, device drivers, redundant processing units, and external disk drive arrays, RAID systems, tape drives, and data archival storage systems, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

In addition, while preferred embodiments of the present invention have been described using specific terms, such description is for illustrative purposes only, and it is to be understood that changes and variations may be made without departing from the spirit or scope of the following claims.

What is claimed is:

1. A computer implemented method for storing and retrieving subsurface rock physical property models for well drilling, comprising:
   generating a plurality of estimated subsurface rock physical property models, each estimated subsurface rock physical property model being based on a respective set of seismic data;
   determining a stratigraphic classification based on seismic interpretation data for each of the plurality of estimated subsurface rock physical property models;
   storing the plurality of estimated subsurface rock physical property models associated with its respective stratigraphic classification in a database;
   determining characteristics of the seismic data used to generate each of the estimated subsurface rock physical property models;
   selecting from the database a subset of the estimated subsurface rock physical property models based on a similarity of the stratigraphic classification;

determining measures of similarity between the characteristics of the seismic data used to generate each of subset of estimated subsurface rock physical property models and a new set of seismic data;
retrieving at least one estimated subsurface rock physical property model from the subset of estimated subsurface rock physical property model based on the similarity measures;
processing a given a seismic image into image texture descriptors for serving as a horizontal filter in determining the measures of similarity;
performing, based on the at least one estimated subsurface rock physical property model, drilling exploration of geolocation associated with the new set of seismic data;
inserting a new well data into the database;
notifying that the new well data is successfully inserted into the database;
searching the database and finding an estimated subsurface rock physical property model associated with seismic data of the new well;
requesting and receiving permission to update the estimated subsurface rock physical property model; and
updating the estimated subsurface rock physical property model based on the new well data;
wherein determining measures of similarity and retrieving at least one estimated subsurface rock physical property model, comprises:
providing a list of available seismic data interpretations based a current set of seismic data from a second area;
selecting a subset of the available seismic data interpretations;
measuring a statistical distribution of the current set of seismic data and its derivatives;
searching the database for models associated with seismic data interpretations having stratigraphic classifications that match those of the selected subset of seismic data interpretations;
comparing a goodness of fit distance of a distribution of a model for each model whose stratigraphic classifications match those of the selected subset of seismic data interpretations; and
retrieving the at least one estimated subsurface rock physical property model based on the comparison.

2. The computer implemented method of claim 1, further comprising normalizing the plurality of subsurface rock physical property models using interpreted reflection horizons.

3. The computer implemented method of claim 2, wherein the stratigraphic classification is based on the interpreted reflection horizons.

4. The computer implemented method of claim 1, wherein the measures of similarity are determined based on multivariate symmetric goodness-of-fit statistical metrics between a given area whose physical properties are to be predicted and the areas used to calibrate the plurality of estimated subsurface rock physical property models.

5. The computer implemented method of claim 1, wherein the measures of similarity include a vertical component determined by comparing the classified seismic stratigraphies.

6. The computer implemented method of claim 1, wherein the measures of similarity include a measure based on image texture descriptors.

7. The computer implemented method of claim 1, wherein at least one of the plurality of estimated subsurface rock physical property models is generated by a method comprising:
selecting a set of seismic data;
providing a list of horizons for the selected set of seismic data;
selecting two or more of the horizons;
providing a list of physical properties available in well logs in vertical area of the selected two or more of the horizons;
selecting a physical property to be modeled;
providing a list of the available wells with the selected physical property;
selecting one or more of the available wells as a reference well to be used to correlate the desired physical property and the seismic data;
selecting derivatives of the set of seismic data; and
running a model estimation algorithm using the selected derivatives to generate the subsurface rock physical property model for the one or more reference wells.

8. The computer implemented method of claim 7, wherein the physical properties available in well logs in the vertical area are defined by a topmost and bottom most of the two or more horizons.

9. The computer implemented method of claim 7, wherein determining characteristics of the seismic data comprises calculating coefficients describing a functional relationship between the selected physical property and the selected seismic data derivatives and storing the coefficients with the estimated model.

10. The computer implemented method of claim 7, wherein determining characteristics of the seismic data comprises calculating a statistical ground truth test on the reference well and storing the result with the estimated model.

11. The computer implemented method of claim 10, wherein determining characteristics of the seismic data comprises calculating a distribution of covariates the set of seismic data and their derivatives on the ground truth tested well and storing with the model.

12. The computer implemented method of claim 11, wherein the distribution of covariates is calculated from the set of seismic data and their derivatives.

13. The computer implemented method of claim 1, further comprising calculating a product of the goodness of fit distance and a statistical ground truth test stored with each model and retrieving the at least one estimated subsurface rock physical property model based on the calculated product.

14. A computer system for storing and retrieving subsurface rock physical property models for well drilling, comprising:
one or more computer processors;
one or more non-transitory computer-readable storage media;
program instructions, stored on the one or more non-transitory computer-readable storage media, which when implemented by the one or more processors, cause the computer system to perform the steps of:
generating a plurality of estimated subsurface rock physical property models, each estimated subsurface rock physical property model being based on a respective set of seismic data;
determining a stratigraphic classification based on seismic interpretation data for each of the plurality of estimated subsurface rock physical property models;
storing the plurality of estimated subsurface rock physical property models associated with its respective stratigraphic classification in a database;

determining characteristics of the seismic data used to generate each of the estimated subsurface rock physical property models;

selecting from the database a subset of the estimated subsurface rock physical property models based on a similarity of the stratigraphic classification;

determining measures of similarity between the characteristics of the seismic data used to generate each of subset of estimated subsurface rock physical property models and a new set of seismic data;

retrieving at least one estimated subsurface rock physical property model from the subset of estimated subsurface rock physical property model based on the similarity measures;

processing a given a seismic image into image texture descriptors for serving as a horizontal filter in determining the measures of similarity;

performing, based on the at least one estimated subsurface rock physical property model, drilling exploration of geolocation associated with the new set of seismic data;

inserting a new well data into the database;

notifying that the new well data is successfully inserted into the database;

searching the database and finding an estimated subsurface rock physical property model associated with seismic data of the new well;

requesting and receiving permission to update the estimated subsurface rock physical property model; and updating the estimated subsurface rock physical property model based on the new well data;

wherein the program instructions cause the computer to generate at least one of the plurality of estimated subsurface rock physical property models by:

selecting a set of seismic data;

providing a list of horizons for the selected set of seismic data;

selecting two or more of the horizons;

providing a list of physical properties available in well logs in the vertical area;

selecting a physical property to be modeled;

providing a list of the available wells with the selected physical property;

selecting one or more of the available wells as a reference well to be used to correlate the selected physical property and the seismic data;

selecting derivatives of the set of seismic data; and running a model estimation algorithm using the selected derivatives to generate the subsurface rock physical property model for the one or more reference wells.

15. The computer system of claim 14, wherein the program instructions cause the computer to perform determining measures of similarity and retrieving at least one estimated subsurface rock physical property model by:

providing a list of available seismic data interpretations based a current set of seismic data from the second area;

selecting a subset of the available seismic data interpretations;

measuring a statistical distribution of the current set of seismic data and its derivatives;

searching the database for models associated with seismic data interpretations having stratigraphic classifications that match those of the selected subset of seismic data interpretations;

comparing a goodness of fit distance of the distribution of the model for each model whose stratigraphic classifications match those of the selected subset of seismic data interpretations; and retrieving the at least one estimated subsurface rock physical property model based on the comparison.

16. A computer program product comprising:

program instructions on a computer-readable storage medium, where execution of the program instructions using a computer causes the computer to perform a method for storing and retrieving subsurface rock physical property models for well drilling, comprising:

generating a plurality of estimated subsurface rock physical property models, each estimated subsurface rock physical property model being based on a respective set of seismic data;

determining a stratigraphic classification based on seismic interpretation data for each of the plurality of estimated subsurface rock physical property models;

storing the plurality of estimated subsurface rock physical property models associated with its respective stratigraphic classification in a database;

determining characteristics of the seismic data used to generate each of the estimated subsurface rock physical property models;

selecting from the database a subset of the estimated subsurface rock physical property models based on a similarity of the stratigraphic classification;

determining measures of similarity between the characteristics of the seismic data used to generate each of subset of estimated subsurface rock physical property models and a new set of seismic data; and retrieving at least one estimated subsurface rock physical property model from the subset of estimated subsurface rock physical property model based on the similarity measures;

processing a given a seismic image into image texture descriptors for serving as a horizontal filter in determining the measures of similarity;

performing, based on the at least one estimated subsurface rock physical property model, drilling exploration of geolocation associated with the new set of seismic data;

inserting a new well data into the database;

notifying that the new well data is successfully inserted into the database;

searching the database and finding an estimated subsurface rock physical property model associated with seismic data of the new well;

requesting and receiving permission to update the estimated subsurface rock physical property model; and updating the estimated subsurface rock physical property model based on the new well data;

wherein execution of the program instructions causes the computer to generate at least one of the plurality of estimated subsurface rock physical property models by:

selecting a set of seismic data;

providing a list of horizons for the selected set of seismic data;

selecting two or more of the horizons;

providing a list of physical properties available in well logs in vertical area;

selecting a physical property to be modeled;

providing a list of the available wells with the selected physical property;

selecting one or more of the available wells as a reference well to be used to correlate the selected physical property and the seismic data;

selecting derivatives of the set of seismic data; and
running a model estimation algorithm using the selected derivatives to generate the subsurface rock physical property model for the one or more reference wells.

17. The computer program product of claim 16, wherein execution of the program instructions causes the computer to perform determining measures of similarity and retrieving at least one estimated subsurface rock physical property model by:
providing a list of available seismic data interpretations based a current set of seismic data from a second area;
selecting a subset of the available seismic data interpretations;
measuring a statistical distribution of the current set of seismic data and its derivatives;
searching the database for models associated with seismic data interpretations having stratigraphic classifications that match those of the selected subset of seismic data interpretations;
comparing a goodness of fit distance of the distribution of the model for each model whose stratigraphic classifications match those of the selected subset of seismic data interpretations; and
retrieving the at least one estimated subsurface rock physical property model based on the comparison.

* * * * *